United States Patent [19]
Cooper

[11] Patent Number: 5,565,819
[45] Date of Patent: Oct. 15, 1996

[54] ACCURATE RC OSCILLATOR HAVING MODIFIED THRESHOLD VOLTAGES

[75] Inventor: Russell E. Cooper, Chandler, Ariz.

[73] Assignee: Microchip Technology Incorporated, Chandler, Ariz.

[21] Appl. No.: 499,602

[22] Filed: Jul. 11, 1995

[51] Int. Cl.$^6$ ................................................ H03K 3/0231
[52] U.S. Cl. .......................................... 331/111; 331/143
[58] Field of Search ...................................... 331/111, 143

[56] References Cited

U.S. PATENT DOCUMENTS

| | | | |
|---|---|---|---|
| 4,122,241 | 10/1978 | Chen | 331/108 D |
| 4,407,588 | 10/1983 | Arichi et al. | 331/111 |
| 4,590,444 | 5/1986 | Wilcox | 331/143 |
| 4,983,931 | 1/1991 | Nakano | 331/111 |
| 5,036,300 | 7/1991 | Nicolai | 331/143 |

*Primary Examiner*—Siegried H. Grimm
*Attorney, Agent, or Firm*—Wigman, Cohen, Leitner & Myers, P.C.

[57] ABSTRACT

An accurate RC oscillator circuit (10) for generating a signal of a predetermined frequency that accurately oscillates between two precise voltage levels, i.e., a low threshold voltage ($V_L$) and a high threshold voltage ($V_H$). The oscillator circuit uses first and second comparators (16, 18) having their outputs respectively coupled to set and reset inputs of a flip flop (20). The output of the flip flop is coupled to a series RC network for controlling the charging and discharging of the voltage across a capacitor (14) of the RC network. The interconnection (12) of the series RC network is coupled to an input of both the first and second comparators. The other input of the first comparator is coupled to a circuit (24) for applying a modified version ($V'_H$) of the high threshold voltage such that the signal generated by the oscillator circuit does not exceed the precise high threshold voltage ($V_H$). Likewise, the other input of the second comparator is coupled to a circuit (25) for applying a modified version ($V'_L$) of the low threshold voltage such that the signal generated by the oscillator circuit does not fall below the precise low threshold voltage ($V_L$).

11 Claims, 2 Drawing Sheets

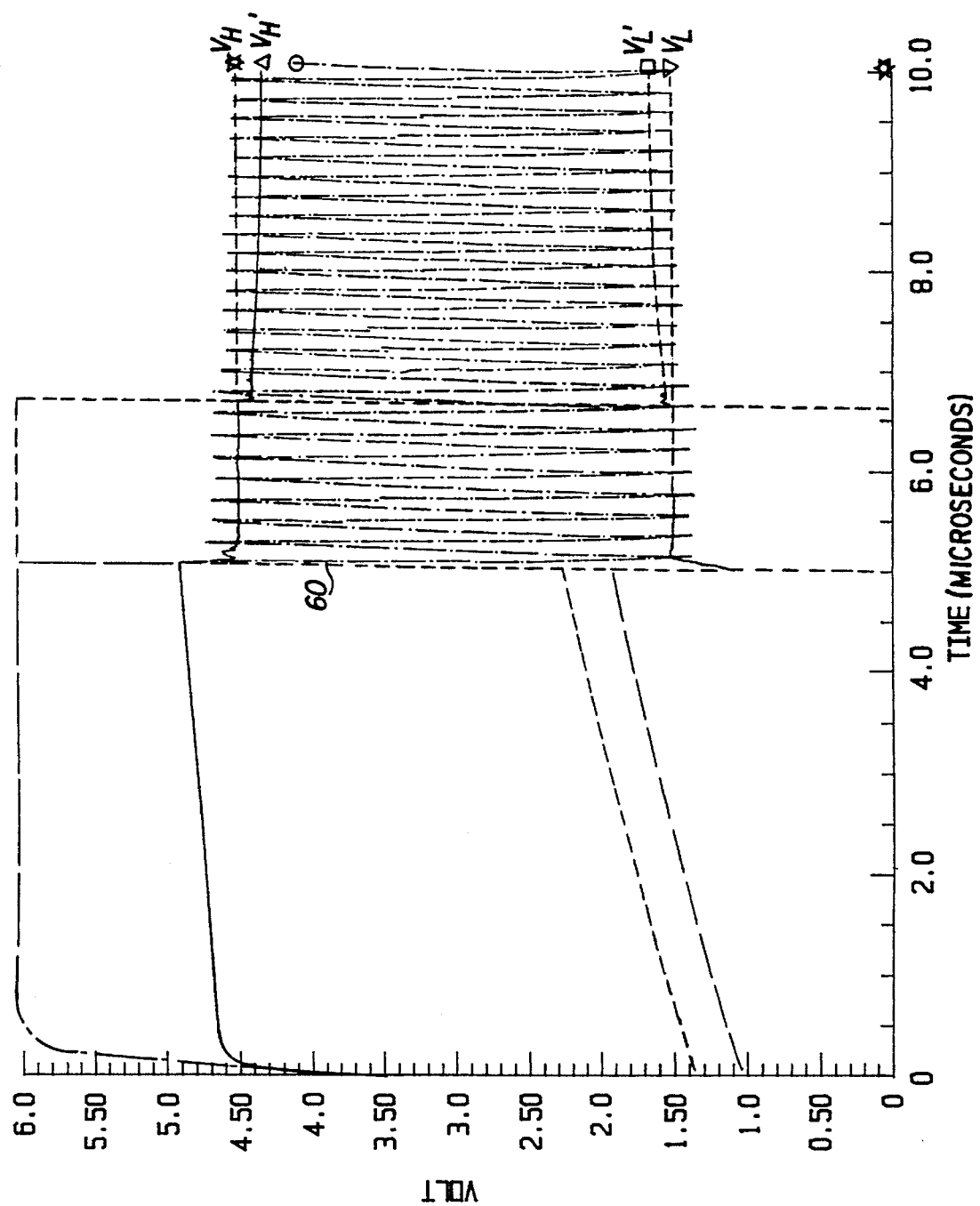

ACCURATE RC OSCILLATOR HAVING MODIFIED THRESHOLD VOLTAGES

BACKGROUND OF THE INVENTION

This invention generally relates to oscillator circuits and, in particular, to an RC oscillator circuit for oscillating at a predetermined frequency by accurately oscillating between two precise voltage levels and having negligible temperature or power supply variation effects.

Oscillator circuits are used in a myriad of applications in the electronics industry for providing clock and other timing signals to electronic circuitry such as microprocessors, microcontrollers, flip-flop circuits, latch circuits, etc. RC oscillator circuits typically include a control circuit coupled to the interconnection between a series resistor-capacitor (RC) network. The control circuit alternately charges or discharges the voltage across the capacitor through the resistor to generate an oscillatory signal appearing across the capacitor. The frequency of oscillation is determined by the time constant of the resistor and capacitor.

One technique for building an RC oscillator is to use a conventional NE555 timer (the 555 timer), manufactured by National Semiconductor, as the circuit that controls the charging and discharging of the capacitor of the RC network. The 555 timer includes a set/reset (SR) flip-flop and first and second comparators. The interconnection between the series RC network is coupled to one input of each of the comparators. The other input of the first comparator is coupled to receive a high threshold voltage ($V_H$) while the other input of the second comparator is coupled to receive a low threshold voltage ($V_L$). The output of first comparator is coupled to the set input of the flip-flop while the output of the second comparator is coupled to the reset input of the flip-flop. An output of the flip-flop is coupled to the resistor of the RC network.

In operation, the first comparator sets the flip-flop, which commences the discharging of the voltage across the capacitor, when the RC oscillatory signal exceeds the predetermined high threshold voltage, and the second comparator resets the flip-flop, which commences the charging of the voltage across the capacitor, when the RC oscillatory signal falls below the predetermined low threshold voltage. In this manner, the signal appearing across the capacitor approximately oscillates between the high and low threshold voltages at a frequency determined by the value of the resistor and capacitor of the RC network.

However, such a configuration suffers from the drawback that by the time the flip-flop is set (or reset) in response to the switching of one of the comparators, the RC oscillatory signal has actually risen above the high threshold voltage (in the case of setting the flip-flop) or has fallen below the low threshold voltage (in the case of resetting the flip-flop). As a result, variations in the frequency of oscillation occur because the RC oscillatory signal does not accurately oscillate between the desired high and low threshold voltages. Such error can be unacceptable when an accurate oscillatory signal is required.

U.S. Pat. No. 4,122,413 to Chen (the "Chen '413 patent") discloses a single pin MOS RC oscillator circuit for oscillating between two threshold levels whose difference remains substantially constant. The RC oscillator circuit includes an external resistor and capacitor connected in series across power supply terminals of an integrated circuit (IC). The IC controls the charging and discharging of the capacitor. The IC is connected to the interconnection of the resistor and capacitor, and includes an MOS switch which is coupled across the capacitor. When the switch is on, the voltage across the capacitor will discharge through the MOS switch, and when the switch is off, the capacitor is charged through the resistor. The IC also includes a pair of inverters having similar but different threshold values, coupled between the resistor and capacitor. Logic circuitry of the IC is coupled to the pair of inverters and configured such that the switch is "off" as long as the capacitor voltage is below the threshold of both inverters, but the switch is "on" when the capacitor voltage exceeds both thresholds. Accordingly, the Chen '413 patent teaches that the voltage across the capacitor will oscillate between the two threshold voltages of the inverters at a frequency set by the RC time constant of the RC network. However, as stated in the Chen '413 patent, the threshold voltages of the inverters are not precise and will vary. However, the threshold voltages will vary in the same direction so that the difference between the threshold voltages will remain substantially constant. Accordingly, the frequency of oscillation remains substantially constant.

It is a principal object of the present invention to provide an RC oscillator circuit for providing a signal that oscillates at a predetermined frequency by accurately oscillating between precise high and low threshold voltage values while being substantially independent of temperature and power supply variations.

SUMMARY OF THE INVENTION

Briefly, the present invention provides a circuit for generating a signal of a predetermined frequency across a capacitor of a series RC network by ensuring that the signal accurately oscillates between two precise voltage levels, i.e., a low threshold voltage ($V_L$) and a high threshold voltage ($V_H$). The circuit includes first and second comparators having their outputs respectively coupled to set and reset inputs of a flip flop. The output of the flip flop is coupled to a series RC network for controlling the charging and discharging of the voltage across the capacitor. The common connection of the series RC network is coupled to an input of both the first and second comparators. The other input of the first comparator is coupled to a voltage modifying circuit for applying a reduced version of the voltage high threshold thereto such that the first comparator switches before the oscillatory signal reaches voltage $V_H$ ensuring that the oscillatory signal accurately reaches voltage $V_H$ by the time the flip flop actually switches. Likewise, the other input of the second comparator is coupled to a voltage modifying circuit for applying an increased version of the voltage low threshold thereto such that the second comparator switches before the oscillatory signal falls below voltage $V_L$ ensuring that the oscillatory signal accurately falls to voltage $V_L$ by the time the flip flop actually switches. In this manner, the circuit generates a signal across the capacitor of the series RC network that accurately oscillates between voltages $V_L$ and $V_H$.

Another object of the present invention is to modify the voltage high and voltage low threshold values of a conventional 555 timer corresponding to the voltage level of the oscillatory signal when the flip-flop switches thereby ensuring that the oscillatory signal accurately oscillates at a precise frequency by accurately oscillating between precise voltage levels.

BRIEF DESCRIPTION OF THE DRAWINGS

FIG. 2 is a graphical diagram illustrating an exemplary oscillatory signal of the present invention.

DETAILED DESCRIPTION OF THE PREFERRED EMBODIMENT

Figure 1:
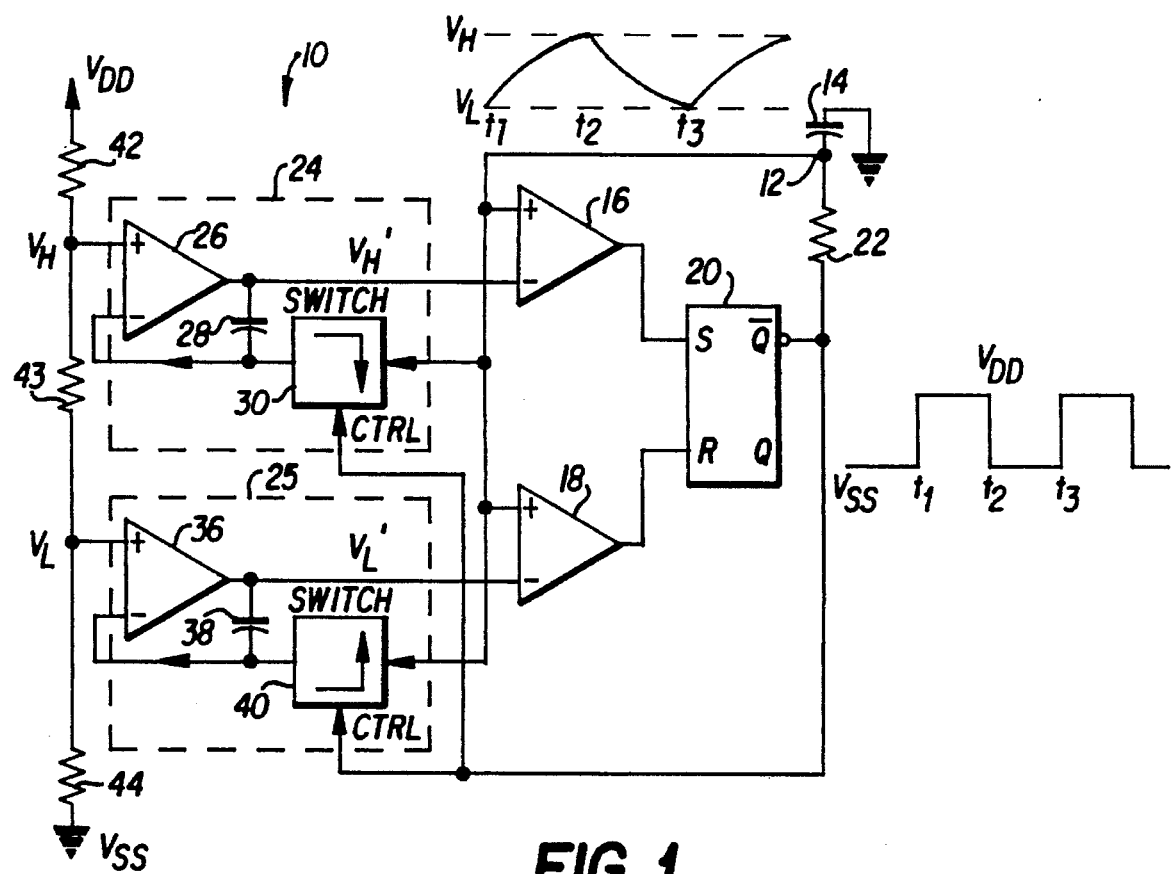
FIG. 1 is a detailed block diagram illustrating an RC oscillator circuit for generating an oscillatory signal of a predetermined frequency that accurately oscillates between precise predetermined voltage levels.

Referring to FIG. 1, RC oscillator circuit 10 is shown for generating an oscillatory signal of a predetermined frequency by accurately oscillating between precise predetermined voltage levels, for example, predetermined high and low voltage thresholds. Oscillator circuit 10 generates an oscillatory signal at circuit node 12 (i.e., across capacitor 14), that accurately oscillates between low and high threshold voltage values. The frequency of oscillation is determined by the time constant of the resistor (22) and the capacitor (14) wherein the frequency of oscillation is inversely proportional to the product of $R_{22}$ and $C_{14}$ as will be shown hereinafter.

Oscillator circuit 10 includes comparators 16 and 18 and S/R flip flop 20 all of which comprise the components of a conventional 555 timer. Comparators 16 and 18 have outputs respectively coupled to the set and reset inputs of SR flip-flop 20. Circuit node 12, which is the interconnection of the RC network comprised of capacitor 14 and resistor 22, is coupled to the non-inverting input of comparator 16 and the inverting input of comparator 18. The inverting input of comparator 16 is coupled to receive a modified version of the high threshold voltage ($V_H$), as represented by $V'_H$. Likewise, the non-inverting input of comparator 18 is coupled to receive a modified version of the low threshold voltage ($V_L$) as represented by $V'_L$.

An inverting output of flip-flop 20 is coupled through resistor 22 to circuit node 12. The output of flip-flop 20 switches between the supply voltages applied to flip-flop 20, for example, between voltages $V_{DD}$ and $V_{SS}$, depending on whether the flip-flop is being set or reset. For example, when flip-flop 20 is set, the inverting output of flip-flop 20 switches from a logic 1 to a logic 0 and, thus, transitions from voltage $V_{DD}$ to voltage $V_{SS}$.

It is noteworthy that although the preferred embodiment utilizes the inverting output of flip flop 20, the non-inverting output of flip flop 20 could have been used wherein the connections from comparators 16 and 18 to the set and reset inputs of flip flop 20 would be reversed. Alternately, the inputs of each comparator could be swapped to provide the inverted polarity at their respective outputs.

Oscillator circuit 10 further includes voltage modifying circuits 24 and 25 for respectively generating modified high and low threshold voltages applied to comparators 16 and 18 based upon the overshoot (of voltage $V_H$) or undershoot (of voltage $V_L$) of the oscillatory signal appearing at circuit node 12 when flip flop 20 switches. In particular, circuit 24 generates and applies a modified voltage $V'_H$ to the inverting input of comparator 16 so that by the time flip flop 20 actually switches in response to the oscillatory signal exceeding modified voltage $V'_H$, the oscillatory signal is substantially equal to the predetermined high threshold voltage $V_H$. Likewise, circuit 25 generates and applies a modified voltage $V'_L$ to the inverting input of comparator 18 so that by the time flip flop 20 actually switches in response to the oscillatory signal falling below modified voltage $V'_L$, the oscillatory signal is substantially equal to the predetermined low threshold voltage $V_L$. In this manner, the present invention provides a signal appearing at circuit node 12 that accurately oscillates between voltages $V_L$ and $V_H$. This ensures that the signal at circuit node 12 oscillates at a predetermined and substantially constant frequency.

Voltage modifying circuit 24 includes amplifier 26 for generating and applying a modified version of the high threshold voltage to comparator 16. Amplifier 26 has a first input coupled to receive high threshold voltage $V_H$. The second input of amplifier 26 is coupled to a first terminal of capacitor 28, the latter having a second terminal coupled to the output of amplifier 26. The output of amplifier 26 is further coupled to the inverting input of comparator 16. Circuit 24 also includes switch 30, coupled between circuit node 12 and the second input of amplifier 26, and having a control input coupled to the inverting output of flip flop 20.

In operation, amplifier 26 is coupled in a unity gain configuration with feedback capacitor 28 such that the voltage across capacitor 28 is the voltage difference between $V'_H$ and $V_H$, ($V'_H-V_H$), since amplifier 26 maintains the voltages appearing at its inverting and non-inverting inputs substantially equal. Further, voltage $V'_H$ is initially set to be equal to voltage $V_H$. However, when flip flop 20 switches from a logic high to a logic low, switch 30 momentarily closes and connects circuit node 12 to the first terminal of capacitor 28. This forces a sample of the voltage appearing at circuit node 12, $V_{12}$, (i.e., the voltage of the oscillatory signal) to appear at the first terminal of capacitor 28. Accordingly, the voltage across capacitor 28 will change by the difference between the voltage sampled at circuit node 12 and voltage $V_H$ such that the voltage across the capacitor becomes more positive if $V_H>V_{12}$ and less positive if $V_H<V_{12}$. In this manner, the capacitor 28 effectively stores this voltage difference. Moreover, once $V_H=V_{12}$ (at the sample time), the voltage across the capacitor will not change and the overshoot condition will have been corrected.

In particular, when the oscillatory signal overshoots voltage $V_H$, the sampled voltage appearing at the first terminal of capacitor 28 will be greater than voltage $V_H$. Accordingly, amplifier 26 will respond by lowering the voltage across capacitor 28 and, thus, lowering voltage $V'_H$ by the amount of the voltage overshoot. Put another way, amplifier 26 generates modified voltage $V'_H$ that is equal to the voltage difference between the sampled voltage at circuit node 12 and voltage $V_H$ and applies this voltage to comparator 16. Moreover, because the sample time is very short, for example, on the order of 5 nanoseconds, it may take a few iterations from start-up before the oscillatory signal precisely reaches the high threshold voltage $V_H$ with no overshooting. Thereafter, however, comparator 16 will switch when the voltage at circuit node 12 exceeds voltage $V'_H$ such that by the time flip flop 20 actually switches and begins to discharge the voltage at circuit node 12, the voltage at circuit node 12 has accurately and precisely reached the desired high threshold voltage value of voltage $V_H$.

Likewise, voltage modifying circuit 25 includes amplifier 36 for generating and applying a modified version of the low threshold voltage to comparator 18. Amplifier 36 has a first input coupled to receive low threshold voltage $V_L$. The second input of amplifier 36 is coupled to a first terminal of capacitor 38, the latter having a second terminal coupled to the output of amplifier 36. The output of amplifier 36 is further coupled to the inverting input of comparator 18. Circuit 25 also includes switch 40, coupled between circuit node 12 and the second input of amplifier 36, and having a control input coupled to the inverting output of flip flop 20.

Similar to amplifier 26, amplifier 36 is coupled in a unity gain configuration with feedback capacitor 38 such that the voltage across capacitor 38 is the voltage difference between $V'_L$ and $V_L$ ($V'_L-V_L$). Further, voltage $V'_L$ is initially set to be equal to voltage $V_L$. When flip flop 20 switches from a logic low to a logic high, however, switch 40 momentarily closes and connects circuit node 12 to the first terminal of capacitor 38. This forces a sample of the voltage appearing at circuit node 12 to appear at the first terminal of capacitor 38. Accordingly, the voltage across capacitor 38 will change by the difference between the voltage sampled at circuit node 12 and voltage $V_L$ and capacitor 38 effectively stores this voltage difference. For example, when the oscillatory signal undershoots voltage $V_L$, the sampled voltage appearing at the first terminal of capacitor 38 will be less than voltage $V_L$. Accordingly, amplifier 26 will respond by increasing the voltage across capacitor 38 and, thus, increasing voltage $V'_L$ by the voltage amount equal to the voltage difference between the sampled voltage and voltage $V_L$ and apply this voltage to comparator 18. Again, because the sample time is very short, it may take a few iterations before the oscillatory signal precisely reaches the low threshold voltage $V_L$ with no undershoot. Thereafter, comparator 18 will switch when the voltage at circuit node 12 exceeds voltage $V'_L$ such that by the time flip flop 20 actually switches and begins to charge the voltage at circuit node 12, the voltage at circuit node 12 has accurately reached the desired low threshold voltage value of voltage $V_L$.

Referring to FIG. 2, a graphical diagram illustrating an exemplary simulated oscillatory signal of the present invention is shown. After several iterations, the oscillatory signal (60) precisely oscillates at a predetermined frequency, as set by the time constant of resistor 22 and capacitor 14, by precisely oscillating between voltages $V_L$, and $V_H$. By way of example only, FIG. 2 illustrates that for voltages $V_L$ and $V_H$ respectively equal to 1.5 and 4.5 volts, voltages $V'_L$ and $V'_H$, which are initially set to 1.5 and 4.5 volts, respectively, approach the values of about 1.7 and 4.3 volts, respectively, to ensure that oscillatory signal 60 accurately oscillates between the desired low and high threshold voltages $V_L$ and $V_H$.

The oscillation frequency of RC oscillator circuit 10 may also be designed to be independent of both temperature and power supply. Temperature independence may be achieved if resistors 42–44 each have the same temperature coefficient and resistor 22 is made to be independent of temperature. Resistors 42–44 can be made to have identical temperature coefficients if they are manufactured from the same material and their values are exact multiples of each other. Furthermore, temperature independence of resistor 22 is obtainable in many integrated circuit processes by making a metallized thin film resistor having substantially constant resistance over a wide range of temperature.

To achieve power supply independence, one first observes that the oscillatory voltage signal appearing at circuit node 12 ($V_{12}$) can be expressed as shown in EQN. 1

$$V_{12}=(V_{DD}-V_{SS})\times\exp[-t/(R_{22}\times C_{14})] \qquad \text{EQN. 1}$$

where exp [x] denotes $2.7182818^x$.

The time ($t_{H-L}$) required to discharge the capacitor from voltage $V_H$ to voltage $V_L$, which is also equal the time required to charge the capacitor from voltage $V_L$ to voltage $V_H$ (assuming the values of resistors 42 and 44 are equal). This can be as shown in EQN. 2.

$$t_{H-L}=-(R_{22}\times C_{14})\times[\ln(V_L/(V_{DD}-V_{SS}))-\ln(V_H/(V_{DD}-V_{SS}))] \qquad \text{EQN. 2}$$

where ln[x] denotes the natural logarithm of x.

Since voltages $V_L$ and $V_H$ can be expressed as functions of $V_{DD}$ and $V_{SS}$ as shown in EQNs. 3 and 4, $$V_L=K_L\times(V_{DD}-V_{SS}) \qquad \text{EQN. 3}$$

where $K_L$ is a constant equal to $(R_{44})/(R_{42}+R_{43}+R_{44})$;

$$V_H=K_H\times(V_{DD}-V_{SS}) \qquad \text{EQN. 4}$$

where $K_H$ is a constant equal to $(R_{43}\times R_{44})/(R_{42}+R_{43}+R_{44})$; then time $t_{H-L}$ is independent of power supply as shown in EQN 5.

$$t_{H-L}=-(R_{22}\times C_{14})\times[\ln(K_L)-\ln(K_H)] \qquad \text{EQN. 5}$$

Furthermore, since the period of the oscillatory signal is ($2\times t_{H-L}$), the frequency of oscillation is $1/(2\times t_{H-L})$ which is correspondingly independent of power supply.

Figure 3:
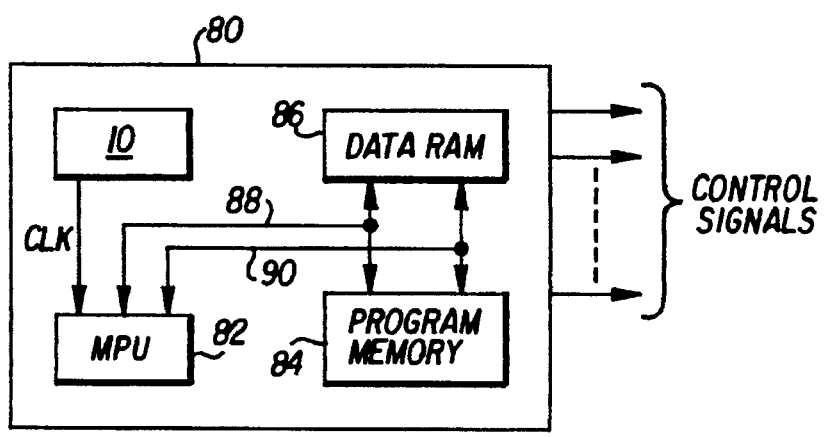
FIG. 3 is a simplified block diagram illustrating the RC oscillator circuit of FIG. 1 incorporated within a microcontroller.

The RC oscillator circuit of the present invention can be utilized to provide clocking and timing signals to various electronic circuits. As an example, FIG. 3 illustrates a simplified block diagram of microcontroller 80 incorporating oscillator circuit 10 of FIG. 1. Oscillator circuit 10 provides its oscillatory signal, as represented by signal CLK, to microprocessor unit (MPU) 82 which is to be used for deriving various precise clock, timing and counting signals for use by the microcontroller. Microcontroller 80 also typically includes program memory 84 and data random access memory (RAM) 86 coupled to MPU 82 via address bus 88 and data bus 90, wherein MPU 82 executes program code stored in the program memory in a well known manner for generating control signals for selectively controlling an external system (not shown).

By now it should be apparent that the present invention provides an accurate RC oscillator circuit for generating a signal having a predetermined frequency that accurately oscillates between two precise voltage levels, i.e., a low threshold voltage ($V_L$) and a high threshold voltage ($V_H$) while being substantially independent of temperature and power supply variations. The oscillator circuit uses first and second comparators having their outputs respectively coupled to set and reset inputs of a flip flop. The output of the flip flop is coupled to a series RC network for controlling the charging and discharging of the voltage across the capacitor of the RC network. The interconnection of the series RC network is coupled to an input of both the first and second comparators. The other input of the first comparator is coupled to a circuit for applying a modified version of the voltage high threshold such that the signal generated by the oscillator circuit does not exceed the precise high threshold voltage ($V_H$). Likewise, the other input of the second comparator is coupled to a circuit for applying a modified version of the low threshold voltage such that the signal generated by the oscillator circuit does not fall below the precise low threshold voltage ($V_L$).

Although certain preferred embodiments and methods have been disclosed herein, it will be apparent to those skilled in the art from consideration of the foregoing description that variations and modifications of the described embodiments and methods may be made without departing from the true spirit and scope of the invention. Accordingly, it is intended that the invention shall be limited only to the extent required by the appended claims and the rules and principles of applicable law.

I claim:

1. A circuit for generating an oscillatory signal of a predetermined frequency across a series resistor-capacitor (RC) network by ensuring that the oscillatory signal accurately oscillates between first and second voltages generated from a first supply voltage source and where the frequency of oscillation is determined by the time constant of the RC network, the circuit including first and second comparators having their outputs respectively coupled to first and second inputs of a flip flop for setting and resetting the flip flop, an output of the flip flop is coupled to the series RC network for controlling the charging and discharging of the voltage across the capacitor, the interconnection of the series RC network is coupled to an input of both the first and second comparators, the improvement comprising:

a first voltage modifying circuit for receiving the first voltage and for applying a modified version of the first voltage to the other input of the first comparator such that the first comparator switches before the oscillatory signal actually reaches the first voltage thereby ensuring that the oscillatory signal precisely reaches the first voltage by the time the flip flop switches; and a second voltage modifying circuit for receiving the second voltage and for applying a modified version of the second voltage to the other input of the second comparator such that the second comparator switches before the oscillatory signal actually reaches the second voltage thereby ensuring that the oscillatory signal precisely reaches the second voltage by the time the flip flop switches.

2. The circuit according to claim 1 wherein said first voltage modifying circuit includes first means for sampling the oscillatory signal upon switching of the flip flop from a first logic level to a second logic level, and wherein said second voltage modifying circuit includes second means for sampling the oscillatory signal upon switching of the flip flop from said second logic level to said first logic level.

3. The circuit according to claim 1 wherein said first voltage modifying circuit includes first means for adjusting said modified version of the first voltage by the difference between the first voltage and the voltage of the oscillatory signal at the time of switching of the flip flop from a first logic level to a second logic level, and wherein said second voltage modifying circuit includes second means for adjusting said modified version of the second voltage by the difference between the second voltage and the voltage of the oscillatory signal at the time of switching of the flip flop from said second logic level to said first logic level.

4. The circuit according to claim 1 wherein said first voltage modifying circuit includes:

an amplifier having first and second inputs and an output, said first input of said amplifier coupled to receive the first voltage, said output of said amplifier coupled to the other input of the first comparator;

a switch having first and second terminals and a control terminal, said first terminal of said switch coupled to the interconnection of the RC network, said second terminal of said switch coupled to said second input of said amplifier, said control terminal of said switch coupled to the output of the flip flop; and a capacitor coupled between said second input and said output of said amplifier.

5. The circuit according to claim 1 wherein said second voltage modifying circuit includes:

an amplifier having first and second inputs and an output, said first input of said amplifier coupled to receive the second voltage, said output of said amplifier coupled to the other input of the second comparator;

a switch having first and second terminals and a control terminal, said first terminal of said switch coupled to the interconnection of the RC network, said second terminal of said switch coupled to said second input of said amplifier, said control terminal of said switch coupled to the output of the flip flop; and a capacitor coupled between said second input and said output of said amplifier.

6. A circuit for generating an oscillatory signal of a predetermined frequency across a series resistor-capacitor (RC) network by ensuring that the oscillatory signal accurately oscillates between first and second voltages generated from a first supply voltage source where the frequency of oscillation is determined by the time constant of the RC network, comprising:

first and second comparators each having first and second inputs and an output, said first inputs of each of said comparators coupled to the interconnection of the RC network;

a flip flop having first and second inputs respectively coupled to said outputs of said first and second comparators, said flip flop having an output coupled to the RC network;

first voltage modifying means for receiving said first voltage and for applying a modified version of the first voltage to said second input of said first comparator, said modified version of the first voltage being equal to the first voltage adjusted by the voltage difference between the first voltage and the voltage of the oscillatory signal at the time of switching of the flip flop from a first logic level to a second logic level; and second voltage modifying means for receiving said second voltage and for applying a modified version of the second voltage to said second input of said second comparator, said modified version of the second voltage being equal to the second voltage adjusted by the voltage difference between the second voltage and the voltage of the oscillatory signal at the time of switching of the flip flop from said second logic level to said first logic level.

7. The circuit according to claim 6 wherein said first voltage modifying means includes means for sampling the oscillatory signal upon switching of the flip flop from said first logic level to said second logic level, and wherein said second voltage modifying means includes means for sampling the oscillatory signal upon switching of the flip flop from said second logic level to said first logic level.

8. A method for controlling a circuit for generating an oscillatory signal of a predetermined frequency across a series resistor-capacitor (RC) network by ensuring that the oscillatory signal accurately oscillates between first and second voltages which are generated from a first supply voltage and where the frequency of oscillation is determined by the time constant of the RC network, the circuit including first and second comparators and a flip flop configured such that the outputs of the first and second comparators are respectively coupled to first and second inputs of the flip flop, each comparator having one input coupled for receiving the oscillatory signal appearing across the capacitor, the output of the flip flop coupled to the resistor of the series RC network, the method comprising the steps of;

sampling the voltage of the oscillatory signal when the flip flop switches from a first logic state to a second logic state;

generating a modified first voltage equal to the first voltage adjusted by the difference between the first voltage and said sampled voltage of the oscillatory signal when the flip flop switches from said first logic state to said second logic state;

applying said modified first voltage to the other input of the first comparator;

sampling the voltage of the oscillatory signal when the flip flop switches from said second logic state to said first logic state;

generating a modified second voltage equal to the second voltage adjusted by the difference between the second voltage and said sampled voltage of the oscillatory signal when the flip flop switches from said second logic state to said first logic state; and applying said modified second voltage to the other input of the second comparator.

9. A circuit for generating an oscillatory signal of a predetermined frequency across a series resistor-capacitor (RC) network by ensuring that the oscillatory signal accurately oscillates between first and second voltages generated from a first supply voltage source where the frequency of oscillation is determined by the time constant of the RC network, comprising:

means for discharging a voltage across the capacitor commencing when the voltage of the oscillatory signal exceeds a first threshold voltage and for charging said voltage across the capacitor commencing when the voltage of the oscillatory signal falls below a second threshold voltage;

means for obtaining a first sampled voltage of the oscillatory signal upon the commencement of discharging of the voltage across the capacitor;

means for adjusting said first threshold voltage to be the first voltage modified by the voltage difference between the first voltage and said first sampled voltage;

means for obtaining a second sampled voltage of the oscillatory signal upon the commencement of charging of the voltage across the capacitor; and means for adjusting said second threshold voltage to be the second voltage modified by the voltage difference between the second voltage and said second sampled voltage.

10. The circuit according to claim 9 wherein said means for adjusting said first and second threshold voltages each include an amplifier.

11. A microcontroller fabricated on a semiconductor chip to execute programs and instructions and to generate control signals as a result of execution by the microcontroller of programs and instructions for selectively controlling an external controllable system, the microcontroller including processor means for executing instructions, program memory means for storing programs to be executed by the microcontroller and data memory means for storing data, the microcontroller further including:

clock means for providing a clock signal for precise timing and counting within the microcontroller, said clock means including a circuit for generating an oscillatory signal of a predetermined frequency across a series resistor-capacitor (RC) network by ensuring that the oscillatory signal accurately oscillates between first and second voltages generated from a first supply voltage source, the frequency of oscillation is determined by the time constant of the RC network, said circuit including:

means for discharging a voltage across the capacitor commencing when the voltage of the oscillatory signal exceeds a first threshold voltage and for charging said voltage across the capacitor commencing when the voltage of the oscillatory signal falls below a second threshold voltage;

means for obtaining a first sampled voltage of the oscillatory signal upon the commencement of discharging of the voltage across the capacitor;

means for adjusting said first threshold voltage to be the first voltage reduced by the voltage difference between the first voltage and said first sampled voltage;

means for obtaining a second sampled voltage of the oscillatory signal upon the commencement of charging of the voltage across the capacitor; and means for adjusting said second threshold voltage to be the second voltage increased by the voltage difference between the second voltage and said second sampled voltage.

* * * * *